US009823327B2

United States Patent
Tanaka

(10) Patent No.: US 9,823,327 B2
(45) Date of Patent: Nov. 21, 2017

(54) TOUCH DETECTION DEVICE AND VEHICULAR NAVIGATION APPARATUS

(71) Applicant: DENSO CORPORATION, Kariya, Aichi-pref. (JP)

(72) Inventor: Hidetaka Tanaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 835 days.

(21) Appl. No.: 14/364,113

(22) PCT Filed: Aug. 6, 2013

(86) PCT No.: PCT/JP2013/004738
§ 371 (c)(1),
(2) Date: Jun. 10, 2014

(87) PCT Pub. No.: WO2014/054209
PCT Pub. Date: Apr. 10, 2014

(65) Prior Publication Data
US 2014/0358463 A1   Dec. 4, 2014

(30) Foreign Application Priority Data
Oct. 1, 2012   (JP) ................. 2012-219373

(51) Int. Cl.
G06F 3/044   (2006.01)
G01R 35/00   (2006.01)
(Continued)

(52) U.S. Cl.
CPC ......... *G01R 35/00* (2013.01); *G01R 27/2605* (2013.01); *G06F 3/044* (2013.01); *G06F 3/0416* (2013.01); *H03K 17/9622* (2013.01)

(58) Field of Classification Search
CPC ....... G06F 3/044; G06F 3/0416; G01R 35/00; G01R 27/2605
See application file for complete search history.

(56) References Cited

U.S. PATENT DOCUMENTS

| 2008/0140282 A1 | 6/2008 | Ando | |
| 2012/0068760 A1* | 3/2012 | Caldwell | G06F 3/0418 327/517 |
| 2013/0106779 A1* | 5/2013 | Company Bosch | G06F 3/0418 345/174 |

FOREIGN PATENT DOCUMENTS

| JP | H06-162888 A | 6/1994 |
| JP | 2006-222022 A | 8/2006 |

(Continued)

OTHER PUBLICATIONS

International Search Report dated Oct. 29, 2013 in the corresponding PCT application No. PCT/JP2013/004738 (with English translation).
(Continued)

*Primary Examiner* — Kevin M Nguyen
(74) *Attorney, Agent, or Firm* — Posz Law Group, PLC

(57) ABSTRACT

A touch detection device includes: an electrostatic capacitance detection device of each touch sensor; and a touch detection device to each touch sensor. The touch determination device obtains a maximum electrostatic capacitance, a minimum electrostatic capacitance and an intermediate electrostatic capacitance, and determines that the touch operation with respect to the touch sensor having the maximum change amount is performed when both of a first condition that a difference between the maximum electrostatic capacitance and the intermediate electrostatic capacitance exceed a second determination value and a second condition that a difference between the intermediate electrostatic capacitance and the minimum electrostatic capacitance is smaller than a third determination value are satisfied, and determines that a change of the electrostatic capacitance is caused by a noise when at least one of the first condition and the second condition is not satisfied.

4 Claims, 6 Drawing Sheets

(51) Int. Cl.
*G06F 3/041* (2006.01)
*G01R 27/26* (2006.01)
*H03K 17/96* (2006.01)

(56) References Cited

FOREIGN PATENT DOCUMENTS

| | | |
|---|---|---|
| JP | 2007-208682 A | 8/2007 |
| JP | 2010-257046 A | 11/2010 |

OTHER PUBLICATIONS

Written Opinion of the International Searching Authority dated Oct. 29, 2013 in the corresponding PCT application No. PCT/JP2013/004738 (with English translation).

* cited by examiner

TOUCH DETECTION DEVICE AND VEHICULAR NAVIGATION APPARATUS

CROSS REFERENCE TO RELATED APPLICATION

The present disclosure is a U.S. national stage application of PCT/JP2013/004738 filed on Aug. 6, 2013, and is based on Japanese Patent Application No. 2012-219373 filed on Oct. 1, 2012, the contents of which are incorporated herein by reference.

TECHNICAL FIELD

The present disclosure relates to a touch detection device for detecting a touch operation with respect to a capacitive touch sensor, and a vehicular navigation apparatus having the same.

BACKGROUND ART

A touch switch having a capacitive touch sensor as an operation switch for various devices is well known. A touch operation with respect to the touch switch (i.e., a contact operation of a human body such as a finger of a person) is detected as follows. Specifically, a capacitance under a condition that the human body does not contact an electrode of the touch sensor is defined as a standard value (i.e., a base line level). It is determined based on a result (i.e., a difference) for comparing a detection value of the capacitance of the touch sensor with the base line level whether the human body touches or not.

The capacitive touch sensor may cause unwanted operation, i.e., operation error according to the influence of an external electric wave noise. To prevent the operation error, an immunity measure is implemented such that a determination standard is optimized by updating the base line level periodically, so that the influence of the noise is removed as much as possible. However, it may be difficult for this measure to prevent the operation error with respect to an instantaneous noise.

Further, the patent literature No. 1 discloses a technique, as an immunity measure, for comparing the maximum change of the capacitance and the minimum change of the capacitance among multiple switches (i.e., touch sensors), and detecting and controlling a touch operation with using an absolute value of a difference between the maximum change and the minimum change of the capacitance.

The method described in the patent literature No. 1 may be considered as an effective immunity measure if a switch using a touch sensor has a layout such that the switch is arranged in a comparatively narrow area. However, in the method described in the patent literature No. 1, a possibility for failing to prevent the operation error caused by the noise may be high if a localized noise is generated when the switch using the touch sensor has a layout such that the switch is arranged in a comparatively wide area.

PRIOR ART LITERATURES

Patent Literature

[Patent Literature 1]
JP-A-2008-143198

SUMMARY OF INVENTION

It is an object of the present disclosure to provide a touch detection device for preventing an operation error with respect to an external electric wave noise much surely, and a vehicular navigation apparatus having the same.

According to a first aspect of the present disclosure, a touch detection device for detecting a touch operation with respect to m electrostatic capacitive touch sensors, wherein m represents a natural number equal to or larger than three, includes: a electrostatic capacitance detection device that detects an electrostatic capacitance of each touch sensor; and a touch detection device that executes a touch determination process for determining presence or absence of the touch operation with respect to each touch sensor based on a detected electrostatic capacitance of the electrostatic capacitance detection device. The touch determination device detects the touch operation with respect to n touch sensors among m touch sensors simultaneously. N represents a natural number equal to or smaller than (m−2). The touch determination process includes: a change amount calculation step for obtaining a change amount of the detected electrostatic capacitance of each touch sensor based on the detected electrostatic capacitance of the electrostatic capacitance detection device; a maximum value obtaining step for obtaining the detected electrostatic capacitance of the touch sensor having a maximum change amount among the touch sensors as a maximum detected electrostatic capacitance; a change amount determination step for determining whether a difference between the maximum detected electrostatic capacitance and a predetermined standard value exceeds a first determination value; a minimum value obtaining step for obtaining the detected electrostatic capacitance of the touch sensor having a minimum change amount among the touch sensors as a minimum detected electrostatic capacitance when it is determined at the change amount determination step that the difference exceeds the first determination value; an intermediate value obtaining step for obtaining the detected electrostatic capacitance of the touch sensor having a (n+1)-th largest change amount among the touch sensors as an intermediate detected electrostatic capacitance when it is determined at the change amount determination step that the difference exceeds the first determination value; and a determination step for determining that the touch operation with respect to the touch sensor having the maximum change amount is performed when both of a first condition that a difference between the maximum detected electrostatic capacitance and the intermediate electrostatic capacitance exceed a second determination value and a second condition that a difference between the intermediate detected electrostatic capacitance and the minimum detected electrostatic capacitance is smaller than a third determination value are satisfied, and for determining that a change of the electrostatic capacitance is caused by a noise when at least one of the first condition and the second condition is not satisfied.

In the above touch detection device, in a case where the environment around the touch sensor is in the noise environment, the touch operation is not detected erroneously based on the change of the electrostatic capacitance of the touch sensor caused by the influence of the noise, and the touch operation is detected accurately when the touch operation is actually performed. Further, since it is determined, based on the success and failure of the satisfaction of the first and second conditions using the maximum value corresponding to the maximum change amount of the electrostatic capacitance, the minimum value corresponding to the minimum change amount and the intermediate value between the maximum value and the minimum value, whether the touch operation is actually performed or the noise environment provides, the occurrence of the detection error caused by the localized noise is restricted. Specifically, the operation error caused by the external electric wave noise is much surely prevented.

According to a second aspect of the present disclosure, a vehicular navigation apparatus includes: m switches using electrostatic capacitive touch sensors; and the touch detection device according to the first aspect. The touch operation with respect to each switch is detected using the touch detection device.

In the above vehicular navigation apparatus, in a case where the environment around the touch sensor is in the noise environment, the touch operation is not detected erroneously based on the change of the electrostatic capacitance of the touch sensor caused by the influence of the noise, and the touch operation is detected accurately when the touch operation is actually performed. Further, since it is determined, based on the success and failure of the satisfaction of the first and second conditions using the maximum value corresponding to the maximum change amount of the electrostatic capacitance, the minimum value corresponding to the minimum change amount and the intermediate value between the maximum value and the minimum value, whether the touch operation is actually performed or the noise environment provides, the occurrence of the detection error caused by the localized noise is restricted. Specifically, the operation error caused by the external electric wave noise is much surely prevented.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Multiple embodiments according to the present disclosure will be explained with reference to the drawings. Here, the substantially same constitution in each embodiment is defined by the same reference number, and the explanation thereof is skipped.

First Embodiment

The first embodiment will be explained with reference to FIGS. 1 to 6.

Figure 1:
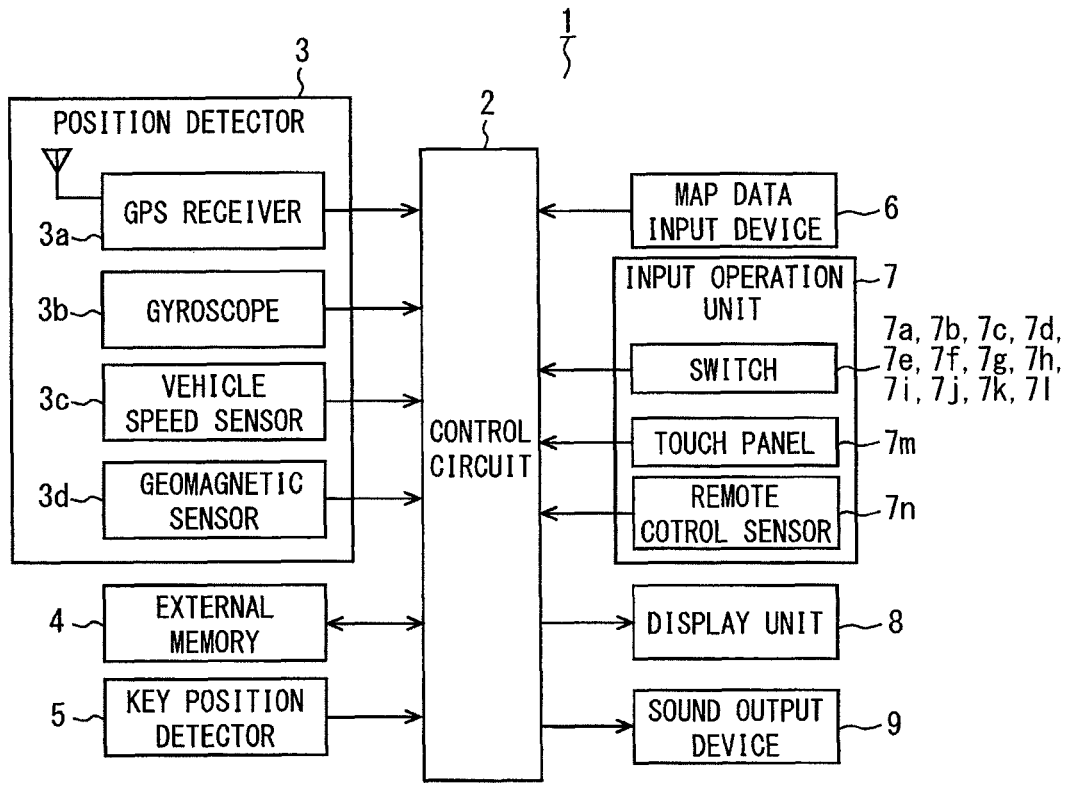
FIG. 1 is a block diagram showing a vehicular navigation apparatus according to a first embodiment.

As shown in FIG. 1, in the vehicular navigation apparatus 1, a control circuit 2 having a function for controlling over whole operations in the apparatus is coupled with a position detector 3, an external memory 4, a key position detecting unit 5, a map data input device 6, an input operation unit 7, a display unit 8, a sound output device 9 and the like.

The control circuit 2 includes a microcomputer mainly. The microcomputer has a CPU, a ROM, a RAM, a I/O, and a bus for connecting these elements (all elements are not shown). The ROM stores a control program for functioning the vehicular navigation apparatus or the like. The RAM temporarily stores a process data in case of executing a program and a map data obtained from the map data input device 6.

The position detector 3 includes: a GPS receiver 3a for receiving a GPS signal from a GPS (global positioning system) satellite and for detecting a position of a vehicle; a gyroscope 3b for detecting a travelling direction of the vehicle; a vehicle speed sensor 3c for detecting a speed of the vehicle in a front-rear direction; a geomagnetic sensor 3d for detecting the travelling direction of the vehicle; and the like. Since each sensor has an error based on an intrinsic characteristic of a respective sensor, each sensor is used while an output result of each sensor is compensated with each other. Here, a part of sensors may be used with respect to a required accuracy. Further, a rotation sensor for detecting a steering angle of a steering wheel and a vehicle wheel sensor arranged at each vehicle wheel may be added.

The external memory 4 includes a flash memory card, for example. For example, the external memory 4 stores a specific data such as a position register data, a music data, a screen image data and the like and these data are read out from the external memory 4. The key position detecting unit 5 detects a position of a key (i.e., a key position) of an ignition switch (not shown) of a car (i.e., a vehicle), on which the vehicle navigation apparatus is mounted so that the unit 5 has a function for detecting an on and off of an engine, i.e., a on and off of a power source. The map data is input through the map data input device 6 for inputting various data including the map data. A memory medium for the map data input device 6 is, in general, a CD-ROM, a DVD or a hard disk. Alternatively, the memory medium may be other mediums such as a memory card or the like.

The display unit 8 includes a color liquid crystal display for displaying a map and a character. The unit 8 is arranged near a driver seat of the vehicle. A marker indicative of a current position of the vehicle, which is input from the position detector 3, and the map data input through the map data input device 6, and an additional data to be displayed on the map such as a guiding route and a mark of a set point is overlapped and displayed. Further, various input screen images for searching and inputting a destination or the like by a user, various messages and information are also displayed. Furthermore, the vehicle navigation apparatus 1 has a construction that notifies a driving guidance to a driver with a sound via the sound output device 9. Thus, the driving guidance is provided to the driver through both of the display of the display unit 8 and the sound output of the sound output device 9.

Figure 2:
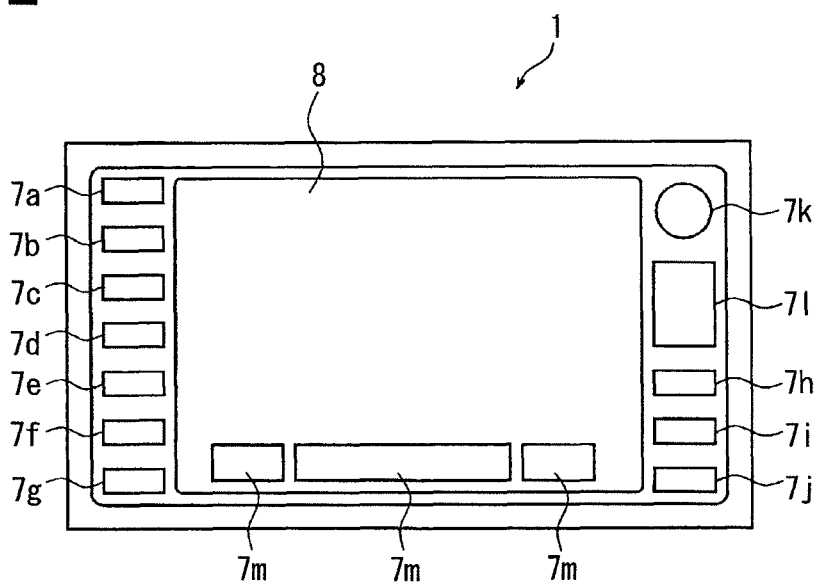
FIG. 2 is an appearance front view of a display unit of the vehicular navigation apparatus as a center of the drawing.

As shown in FIGS. 1 and 2, the input operation unit 7 is arranged integrally with the display unit 8. The unit 7 includes a touch panel 7m using a resistor film, switches 7a-7l arranged on a front side of a body 10 around (i.e., on right and left sides) the display unit 8, and the like. The unit 7 is used for various inputs. The switches 7k, 7l are mechanical push switches (i.e., hardware switches). The switches 7a-7j are constitutions using a capacitive touch sensor, i.e., touch switches. Here, these touch switches may be arranged on top and down sides of the display unit 8. A remote controller (not shown) having the same function as operation elements 7a-7m is arranged. An operation signal from the remote controller is input in the control circuit 2 via the remote control sensor 7n.

Figure 3:
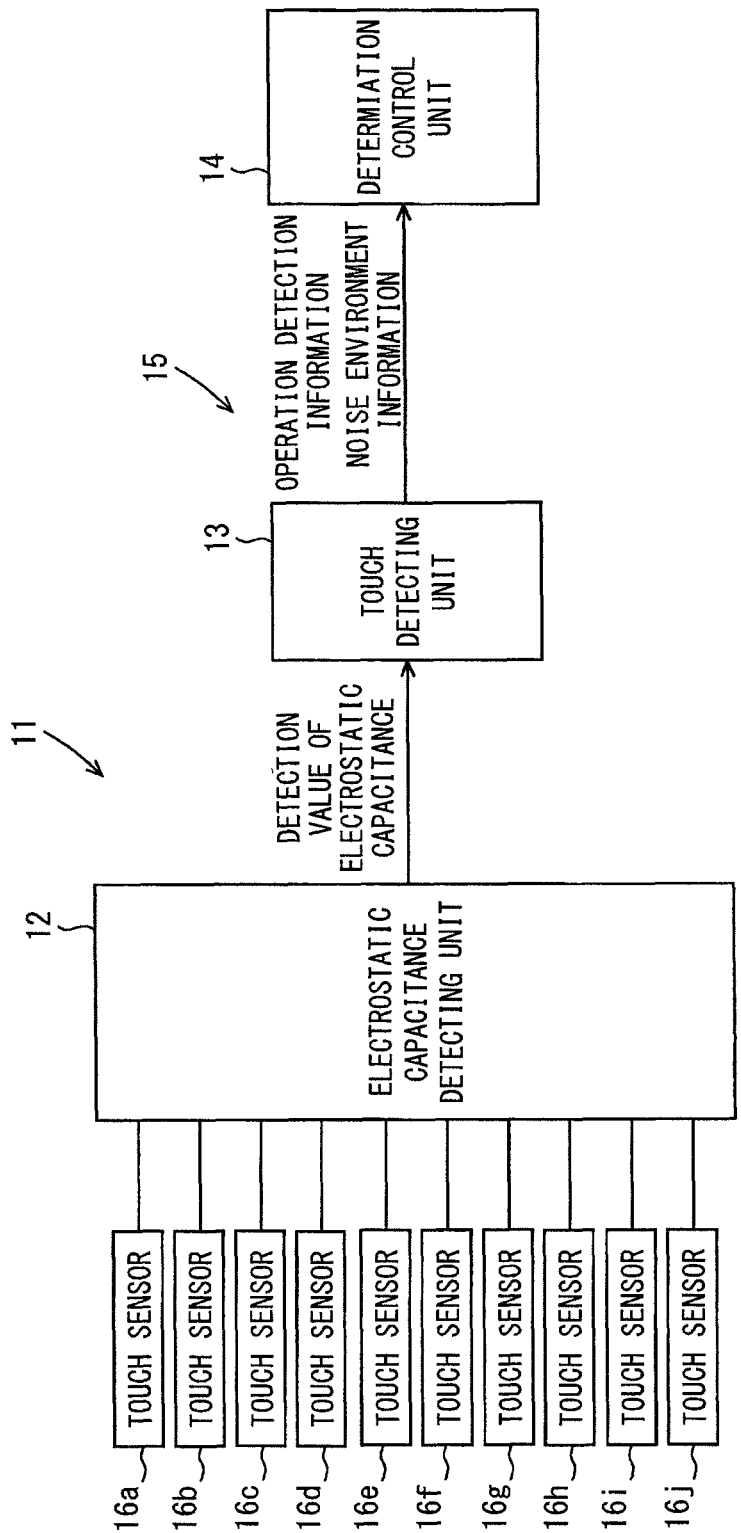
FIG. 3 is a block diagram showing an overview construction of a touch detection device.

A touch operation with respect to the switches 7a-7j, i.e., a touch operation with respect to the touch sensor, is detected by the touch detection device 11 shown in FIG. 3. Here, in FIG. 1, the touch detection device 11 is not shown. The touch detection device 11 has a construction that is capable of detecting a touch operation with respect to one touch switch among ten touch switches 7a-7j simultaneously (m=10 and n=1). The detection result of the touch detection device 11 is input to the control circuit 2. The touch detection device 11 includes an electrostatic capacitance detecting unit 12 (corresponding to an electrostatic capacitance detection device), a tough detecting unit 13 and a determination control unit 14. In the present embodiment, the touch detecting unit 13 and the determination control unit 14 provides the touch detection device 15.

The electrostatic capacitance detecting unit 12 detects an electrostatic capacitance of each touch sensor 16a-16j, which corresponds to a respective switch 7a-7j. A detection value of the electrostatic capacitance of each touch sensor 16a-16j detected by the electrostatic capacitance detecting unit 12 is input to the touch detecting unit 13. Although the detail will be described later, the touch detecting unit 13 has a construction that is capable of executing a touch determination process for determining based on the detection value of the electrostatic capacitance of the touch sensors 16a-16j obtained from the electrostatic capacitance detecting unit 12 whether the touch operation (i.e., the touch operation with respect to the switches 7a-7j) with respect to the touch sensors 16a-16j is performed or not. The touch detecting unit 13 executes the touch determination process when an instruction for executing the process is input from the determination control unit 14.

The touch detecting unit 13 outputs information (i.e., operation detection information and noise environment information) relating to the presence or absence of the touch operation of each touch sensor 16a-16j to the determination control unit 14. The determination control unit 14 outputs an instruction for executing a process of determining the presence or absence of the touch operation to the touch detecting unit 13 at a predetermined period (such as every one-millisecond). Although the detail will be described later, the determination control unit 14 finally determines the presence or absence of the touch operation with respect to the touch sensors 16a-16j based on the operation detection information and the noise environment information obtained from the touch detecting unit 13. The result of the final determination executed by the determination control unit 14 is input, as an operation result of the switches 7a-7j, i.e., the touch sensors 16a-16j, to the control circuit 2.

Next, the detection function of the touch operation with respect to the touch sensors 16a-16j in the touch detection device 11 will be explained with respect to the flowchart shown in FIGS. 4 and 5.

Figure 4:
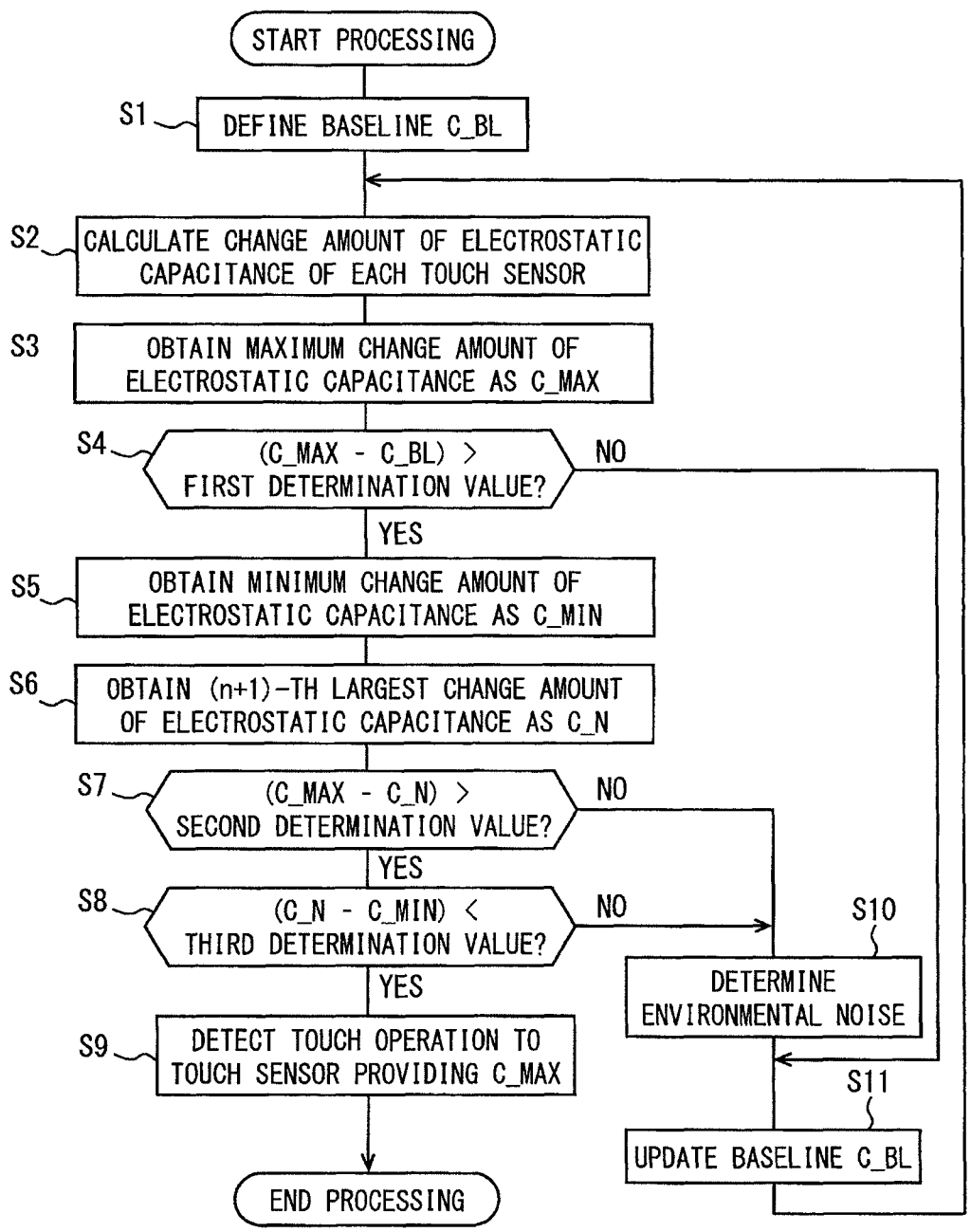
FIG. 4 is a flowchart showing a process content of a touch detecting unit.

The touch determination process executed by the touch detecting unit 13 is shown as a flowchart in FIG. 4. Specifically, at step S1, a baseline C_BL (corresponding to a standard value) is defined. The definition manner of the baseline may be different from each system. One example of the definition manner is a time average method of the most recent electrostatic capacitance. At step S2, the change amount of the electrostatic capacitance of each touch sensor 16a-16j is calculated based on the detection value obtained from the electrostatic capacitance detecting unit 12. The change amount can be obtained as a difference of the electrostatic capacitance at every predetermined sampling period, for example. Step S2 corresponds to a change amount calculation step.

At step S3, the detection value of the touch sensor among the touch sensors 16a-16j corresponding to the maximum change amount obtained at step S2 is obtained as the maximum detection value C_MAX. Step S3 corresponds to the maximum value obtaining step. At step S4, it is determined whether the difference between the maximum value C_MAX and the baseline C_BL exceeds the first determination value. The factor of the first determination value may be different from each system. The first determination value is set appropriately according to an assembling state, a design of a substrate, a specification of a using microcomputer and the like. Step S4 corresponds to a change amount determination step.

When the difference between the maximum value C_MAX and the baseline C_BL exceeds the first determination value (i.e., when the determination at step S4 is "YES"), the change amount of at least one electrostatic capacitance among the touch sensors 16a-16j is large. In this case, it is considered that one of a case (a) where the electrostatic capacitance of the touch sensors 16a-16j is largely changed according to the influence of the external electric wave noise or the like and a case (b) where the touch operation with respect to the touch sensor providing the maximum change amount is actually performed occurs.

Figure 6:
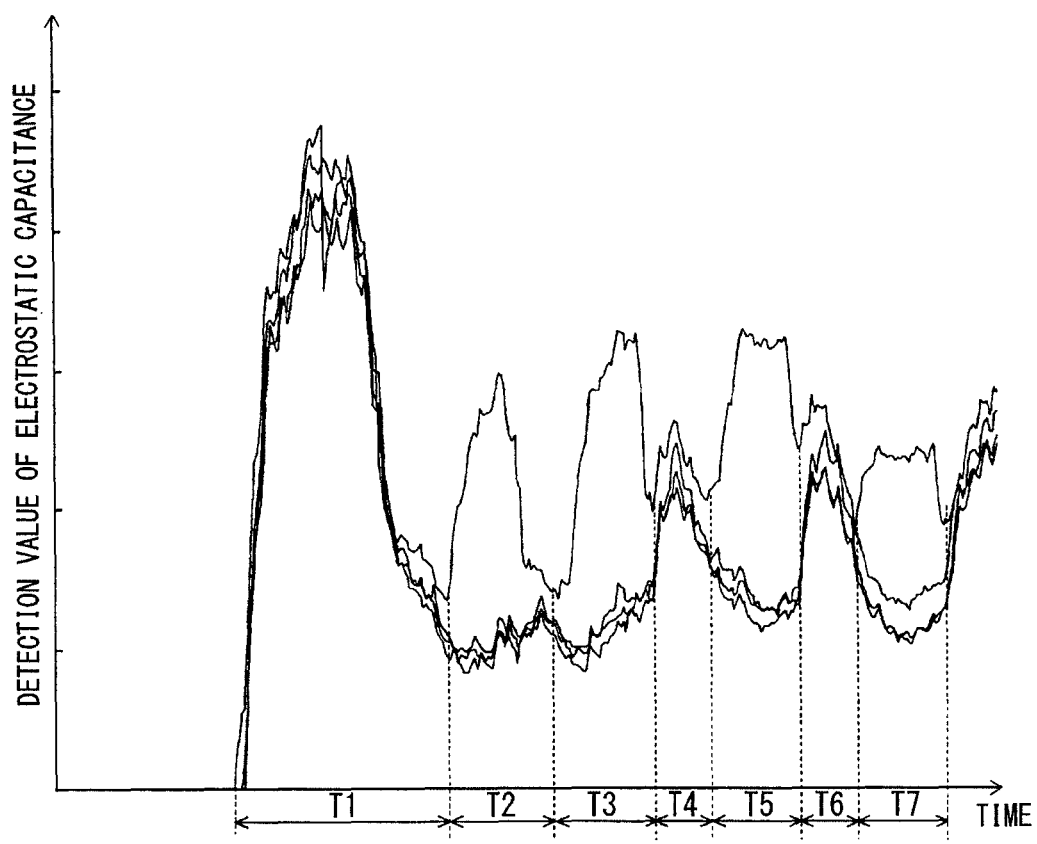
FIG. 6 is a diagram showing an example of a change of a static capacitance in multiple touch sensors.

FIG. 6 roughly shows an example of a change of the detection value of the electrostatic capacitance of four touch sensors. The detection value is shown in FIG. 6 after the high frequency component of the detection value is cut by a low pass filter (LPF). In FIG. 6, the periods T1, T4 and T6 are periods, in which any one of four touch sensors is not touched, and the influence of the external electric wave noise is generated. Specifically, the period T1, T4 and T6 corresponds to the state of the above case (a). During the periods T1, T4 and T6, the detection values of the electrostatic capacitances of four touch sensors are almost similar values since the detection value is changed (i.e., increased) by the influence of the external electric wave noise around the touch sensor or the like.

In FIG. 6, the periods T2, T3, T5 and T7 are periods, in which the touch operation with respect to one touch sensor among four touch sensors is actually performed. Specifically, the period T2, T3, T5 and T7 correspond to the state of the above case (b). In the periods T2, T3, T5 and T7, only the detection value of the electrostatic capacitance of the touch sensor, which is touched (i.e., contacts a human body), among four touch sensors is largely changed. However, the detection values of the electrostatic capacitances of other touch sensors are not changed substantially, and therefore, the detection values are almost similar values to each other. In view of the tendency of the change of the electrostatic capacitance, in the process after step S5 described later, the cases (a) and (b) are distinguished from each other.

On the other hand, when the difference between the maximum value C_MAX and the baseline C_BL is equal to or smaller than the first determination value (i.e., when the determination at step S4 is "NO"), the change amount of all electrostatic capacitances among the touch sensors 16a-16j is small. In this case, it is considered that both of a case (a) where the electrostatic capacitance of the touch sensors 16a-16j is largely changed according to the influence of the external electric wave noise or the like and a case (b) where the touch operation with respect to the touch sensor providing the maximum change amount is actually performed do not occur. Accordingly, it goes to step S5, and the baseline C_BL is updated. After step S11 is performed, it returns to step S2.

At step S5, the detection value of the touch sensor among the touch sensors 16a-16j corresponding to the minimum change amount obtained at step S2 is obtained as the minimum detection value C_MIN. Step S5 corresponds to the maximum value obtaining step. At step S6, the detection value of the touch sensor among the touch sensors 16a-16j corresponding to the (n+1)-th largest change amount, i.e., the second largest change amount, obtained at step S2 is obtained as the intermediate detection value C_N. The intermediate detection value C_N is the detection value of the touch sensor except for the detection value of the touch sensor corresponding to the maximum change amount and the detection value of the touch sensor corresponding to the minimum change amount. Further, the intermediate detection value C_N is the detection value of the touch sensor corresponding to the largest change amount among the detection values, which are not the object of the simultaneous detection. Step S6 corresponds to an intermediate value obtaining step. Here, steps S5 and S6 may be replaceable in the executing order.

At step S7, it is determined whether the difference between the maximum detection value C_MAX obtained at step S3 and the intermediate detection value C_N obtained at step S6 exceeds a second determination value. The second determination value may be set appropriately so as to comply with an applied system. At step S7, when the difference is equal to or smaller than the second determination value (i.e., when the determination is "NO"), it goes to step S10. On the other hand, at step S7, when the difference exceeds the second determination value (i.e., when the determination is "YES"), it goes to step S8.

At step S8, it is determined whether the difference between the intermediate detection value C_N obtained at step S6 and the minimum detection value C_MIN obtained at step S5 falls below a third determination value. The third determination value may be set appropriately so as to comply with an applied system, similar to the first determination value. At step S8, when the difference is equal to or larger than the third determination value (i.e., the determination is "NO"), it goes to step S10. On the other hand, at step S8, when the difference is smaller than the third determination value (i.e., when the determination is "YES"), it goes to step S9. At step S9, it is determined that the touch operation is performed at the touch sensor having the maximum change amount (i.e., the touch operation is presented). The operation detection information indicative of said performance is output.

At step S10, it is determined that the touch operation is not performed at all touch sensors 16a-16j (i.e., the touch operation is not presented), and the electrostatic capacitance is changed by the noise (i.e., environmental noise causes). The noise environment information indicative of said noise is output. After step S10 is performed, it goes to step S11. Thus, in the present embodiment, when the determination at both of steps S7 and S8 is "YES", it is determined that the touch operation with respect to the touch sensor having the maximum change amount is performed. Further, when the determination at step S7 or step S8 is "NO," it is determined that the electrostatic capacitance is changed by the noise. Specifically, in the present embodiment, steps S7 to S10 correspond to a determination step. Further, at step S7, the determination of "YES" corresponds to the first condition.

At step S8, the determination of "YES" corresponds to the second condition. Further, the execution order of steps S7 and S8 may be replaced.

Next, an example of the operation of the vehicular navigation apparatus 1 in a case where the above described process is actually executed by the touch detecting unit 13 will be explained.

(1) Case where a Noise is Generated Instantaneously while the Touch Operation with Respect to the Switch is Performed For example, when a user holds a cell phone, and the user operates one of the switches 7a-7j, the switches 7a-7j receives the influence of the electric wave (corresponding to the external electric wave noise), which is output from the cell phone. Even in this case, the detection error caused by the noise is prevented according to the present embodiment as follows, so that the touch operation is detected after the noise falls. Here, in this case, to simplify the explanation, the number of touch sensors is five (i.e., m=5). Further, each numerical value relating to the electrostatic capacitance used in the following explanation is not the actual value but an explanation value, which is set in order to simplify the explanation for the flow of the operation (i.e., principle).

First, the baseline C_BL is defined (at step S1). Here, the baseline C_BL is 0.1 (i.e., C_BL=0.1). After that, the change amount of the electrostatic capacitance of each touch sensor is calculated (at step S2). Here, five obtained change amounts are, for example, "1.0, 1.1, 1.2, 4.5 and 5.0." Accordingly, the maximum change amount C_MAX obtained at step S3 is 5.0 (i.e., C_MAX=5.0).

Then, it is determined whether the difference between the maximum change amount C_MAX and the baseline C_BL exceeds the first determination value (at step S4). Here, the first determination value is 1.0. Accordingly, the above difference (C_MAX−C_BL) is 4.9 (i.e., =5.0−0.1), and therefore, the difference exceeds the first determination value (i.e., =1.0). Thus, it goes to step S5.

In this case, the minimum change amount C_MIN obtained at steps S5 and S6 is 1.0 (i.e., C_MIN=1.0). The intermediate change amount C_N is 4.5 (i.e., C_N=4.5). After that, it is determined whether the difference between the maximum change amount C_MAX and the intermediate change amount C_N exceeds the second determination value (at step S7). Here, the second determination value is 3.0. Accordingly, the above difference (C_MAX−C_N) is 0.5 (i.e., =5.0−4.5). Thus, the difference is equal to or smaller than the second determination value (i.e., =3.0). Accordingly, it goes to step S10, and it is determined that the environmental noise occurs.

After that, at step S11, the baseline C_BL is updated. It returns to step S2. Here, the baseline C_BL is updated to the same previous value (i.e., =0.1). At step S2 executed on the second time, five obtained change amounts are, for example, "1.0, 1.1, 1.2, 1.1 and 4.5." Specifically, at this moment, the generation of the noise is settled. Accordingly, the maximum change amount C_MAX obtained at step S3 is 4.5 (i.e., C_MAX=4.5).

At step S4 executed successively, the difference (i.e., =4.4) between the maximum change amount C_MAX and the baseline C_BL exceeds the first determination value (i/e/.=1.0). Accordingly, it goes to step S5. In this case, the minimum change amount C_MIN obtained at steps S5 and S6 is 1.0 (i.e., C_MIN=1.0). The intermediate change amount C_N is 1.2 (i.e., C_N=1.2). Then, at step S7 successively performed, the above difference (i.e., C_MAX−

C_N) is 3.3 (i.e., =4.5-1.2). Thus, the difference exceeds the second determination value (i.e., =3.0). Thus, it goes to step S8.

Then, it is determined whether the difference between the intermediate change amount C_N and the minimum change amount C_MIN exceeds the third determination value (at step S8). Here, the third determination value is 1.5. Accordingly, the difference (C_N−C_MIN) is 0.2 (i.e., =1.2-1.0). The difference is smaller than the third determination value (i.e., =1.5). Thus, it goes to step S9. It is determined that the touch operation with respect to the touch sensor having the maximum change amount is performed. Thus, in the present process, even if the instantaneous noise is generated, the occurrence of the detection error (operation error) caused by the influence of the noise is prevented, and the touch operation with respect to the touch sensor is detected just after the noise is settled.

(2) Case where a Noise is Generated while the Touch Operation with Respect to the Switch is not Performed For example, when an electric device such as a cell phone outputting an electric wave approaches the switches 7a-7j, the switches 7a-7j are affected by the influence of the electric wave (corresponding to the external electric wave noise). Even in such a case, in the present embodiment, the detection error caused by the noise is prevented as follows.

First, the baseline C_BL is defined (at step S1). Here, the baseline C_BL is 0.1 (i.e., C_BL=0.1). After that, the change amount of the electrostatic capacitance of each touch sensor is calculated (at step S2). Here, five obtained change amounts are, for example, "1.0, 1.1, 1.2, 4.5 and 5.0." Accordingly, the maximum change amount C_MAX obtained at step S3 is 5.0 (i.e., C_MAX=5.0).

Then, it is determined whether the difference between the maximum change amount C_MAX and the baseline C_BL exceeds the first determination value (at step S4). Here, the first determination value is 1.0. Accordingly, the above difference (C_MAX−C_BL) is 4.9 (i.e., =5.0−0.1), and therefore, the difference exceeds the first determination value (i.e., =1.0). Thus, it goes to step S5.

In this case, the minimum change amount C_MIN obtained at steps S5 and S6 is 1.0 (i.e., C_MIN=1.0). The intermediate change amount C_N is 4.5 (i.e., C_N=4.5). After that, it is determined whether the difference between the maximum change amount C_MAX and the intermediate change amount C_N exceeds the second determination value (at step S7). Here, the second determination value is 3.0. Accordingly, the above difference (C_MAX−C_N) is 0.5 (i.e., =5.0-4.5). Thus, the difference is equal to or smaller than the second determination value (i.e., =3.0). Accordingly, it goes to step S10, and it is determined that the environmental noise occurs. After that, at step S11, the baseline C_BL is updated. It returns to step S2. Thus, in the present process, even in a state (i.e., noise environment) that the noise is generated around the switches 7a-7j, the occurrence of the detection error (i.e., operation error) caused by the influence of the noise is prevented.

The process executed by the determination control unit 14 is shown as a flowchart in FIG. 6. Specifically, at step U1, based on the noise environment information obtained from the touch detecting unit 13, it is determined whether the environmental noise is generated. When it is determined that the environmental noise occurs (i.e., when the determination at step U1 is "YES"), it goes to step U2. When it is determined that the environmental noise does not occur (i.e., when the determination at step U1 is "NO"), it goes to step U3. At step U2, a variable α is set to be a set value x (e.g., "4") (i.e., α=4). At step U3, a variable α is set to be a set value y (e.g., "2") (i.e., α=2). The variable α is used for defining the number of times of consecutive touch determinations with respect to the same touch sensor later described. The set values x, y are natural numbers to be satisfied with an equation of "x>y." The set values x, y may be changeable appropriately.

At step U4, based on the operation detection information obtained from the touch detecting unit 13, it is confirmed whether touch determination with respect to each touch sensor 16a-16j is presented or not. When the touch determination with respect to each touch sensor 16a-16j is not presented (i.e., when the determination at step U4 is "NO"), the process ends without doing anything (i.e., END). On the other hand, when the touch determination with respect to at least one of touch sensors 16a-16j is presented (i.e, when the determination at step U4 is "YES"), it goes to step U5.

At step U5, it is determined whether the touch operation with respect to the same touch sensor is performed a times (corresponding to the determination time) consecutively. When it is determined that the touch determination with respect to the same touch sensor is performed a times consecutively (i.e., when the determination at step U5 is "YES"), it is finally determined that the touch operation with respect to that touch sensor is performed. On the other hand, when it is determined that the touch determination with respect to the same touch sensor is not performed a times consecutively (i.e., when the determination at step U5 is "NO"), the process ends without doing anything (END).

As explained above, in the present embodiment, when the environment around the switches 7a-7j (i.e., the touch sensors 16a-16j) is in the noise environment, the touch operation is not detected mistakenly based on the change of the electrostatic capacitance of the touch sensor caused by the influence of the noise. Further, when the touch operation is actually performed under a condition of the noise environment, the touch operation is detected with high accuracy just after the noise is settled.

Here, in a prior art, if it is determined based on the comparison (i.e., the difference) between the maximum change amount C_MAX, which is the maximum change amount of the electrostatic capacitance, and the minimum change amount C_MIN, which is the minimum change amount, whether the touch operation is performed or not, the following problem may arise. Specifically, if a localized noise is generated when each touch sensor has a layout such that the touch sensor is arranged in a comparatively wide area, the electrostatic capacitance of one touch sensor, which is affected most by the influence of the noise, remarkably increases. Further, the electrostatic capacitance of another touch sensor arranged near the one touch sensor increases moderately, compared with the one touch sensor. Furthermore, the electrostatic capacitance of further another touch sensor disposed far from the noise generation place is not changed substantially. In this case, a possibility for mistakenly determining that the touch operation with respect to the one touch sensor, of which the electrostatic capacitance remarkably increases, is high according to the determination using the difference between the maximum change value and the minimum change value.

On the other hand, in the present embodiment, it is determined whether the environmental noise causes or the touch operation is actually performed, based on the comparison the maximum change amount C_MAX or the minimum change amount C_MIN with the intermediate change amount disposed between the maximum change amount and the minimum change amount and being the detection value of the touch sensor, which is not the object of the simultaneous detection, corresponding to the maximum change amount (i.e., based on the success and failure of the satisfaction of the first condition and the second condition). Accordingly, even when each touch sensor has a layout such that the touch sensor is arranged in a comparatively wide area, the occurrence of the detection error caused by the localized noise is restricted. For example, in case of the vehicular navigation apparatus 1, when a passenger riding in a front passenger seat talks via the cell phone, only the switches 7a-7g arranged on a front passenger seat side is affected by the influence of the electric wave output from the cell phone. Even in such a case, in the present embodiment, the occurrence of the detection error caused by the localized noise is restricted.

The touch detecting unit 13 repeatedly executes the touch determination process with a predetermined period. The determination control unit 14 finally determines in the touch determination process repeatedly executed that the touch operation with respect to the touch sensor is performed when it is determined that the touch operation is performed a times consecutively. When this process is performed, an effect is obtained such that the detection error caused by the instantaneous noise is restricted. The determination control unit 14 sets the value of a to be two when it is determined that the noise environment is not presented. The unit 14 sets the value of a to be four when it is determined that the noise environment is presented. Specifically, in the touch determination process, when it is determined that the change of the electrostatic capacitance is caused by the noise, the number of times of consecutive touch determinations increases. According to this process, the restriction effect of the detection error with respect to the instantaneous noise is much improved.

Second Embodiment

A second embodiment of the present disclosure will be explained with reference to FIG. 7.

In the present embodiment, the touch detection device 11 has a construction that is capable of simultaneously detecting the touch operation with respect to two or more touch switches among ten touch switches 16a-16j (i.e., m=10, n>=2). Accordingly, the process (i.e., the touch determination process) executed by the touch detecting unit 13 is changed to the following manner. For example, when the device 11 has a construction that is capable of detecting the touch operation with respect to two touch switches, the steps shown in FIG. 7 are added to the determination steps (i.e., steps S7 to S10).

Figure 7:
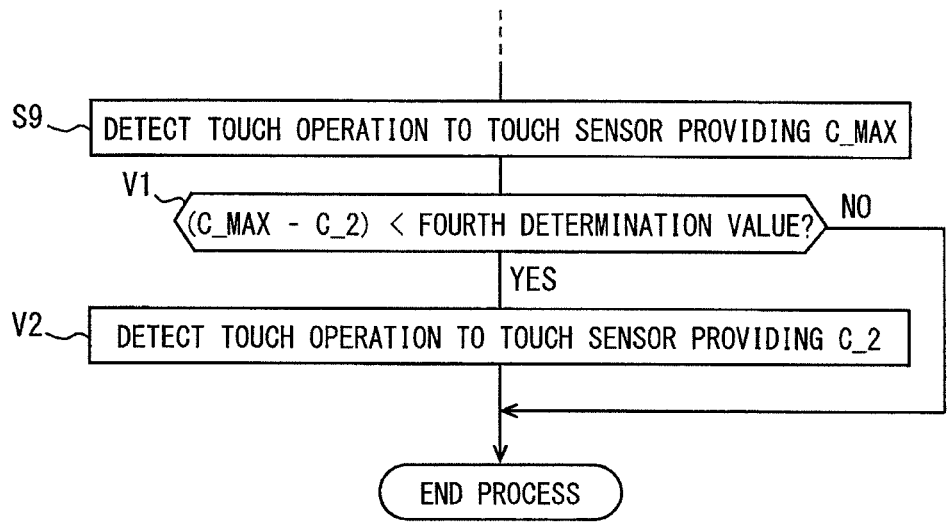
FIG. 7 is a diagram showing a process added to a determination step according to a second embodiment.

As shown in FIG. 7, after it is determined at step S9 that the touch operation with respect to the touch sensor having the maximum change amount of the electrostatic capacitance is performed, step V1 is executed. At step V1, it is determined whether the difference between the maximum change amount C_MAX and the detection value C_2 of the touch sensor having the second largest change amount of the electrostatic capacitance is smaller than a fourth determination value. The fourth determination value may be set appropriately so as to comply with an applied system, similar to the first determination value. At step V1, when the difference is equal to or larger than the fourth determination value (i.e., when the determination is "NO"), it is considered that the touch operation with respect to only one touch sensor is performed. Accordingly, the process ends without executing step V2. On the other hand, at step V1, when the difference is smaller than the fourth determination value (i.e., when the determination is "YES"), it is considered that the touch operation with respect to two touch sensors is performed. Thus, it goes to step V2. At step V2, it is determined that the touch operation with respect to the touch sensor having the second largest change amount is performed (i.e., the touch operation is presented). The operation detection information indicative of two touch operations is output.

Here, when the device 11 has a construction that is capable of simultaneously detecting the touch operation with respect to three or more touch switches (i.e., n>=3), the steps shown in FIG. 7 is changed as follows. Specifically, a difference between the maximum change amount C_MAX and the detection value of each of the touch sensors having the second largest change amount to the n-th largest change amount among ten touch sensors 16a-16j is obtained. It is determined that the touch operation with respect to the touch switch having the detection value corresponding to the difference smaller than the fourth determination value is performed. Further, the operation detection information indicative of the touch operation is output.

As explained above, the present embodiment provides the following effect. Specifically, there is a case where the specification of a manufacturing product provides a function, which is realized when two or more switches are operated simultaneously. In the present embodiment, the effects are obtained such that this function (i.e., multi-touch function) is achieved, and further, the operation error with respect to the external electric wave noise is prevented.

Third Embodiment

A third embodiment of the present disclosure will be explained with reference to FIG. 8.

In the present embodiment, the touch detection device 11 has a construction that is capable of simultaneously detecting the touch operation with respect to one or more touch switches among ten touch switches 16a-16j (i.e., m=10, n>=1). Accordingly, the process (i.e., the touch determination process) executed by the touch detecting unit 13 is changed to the following manner.

Figure 8:
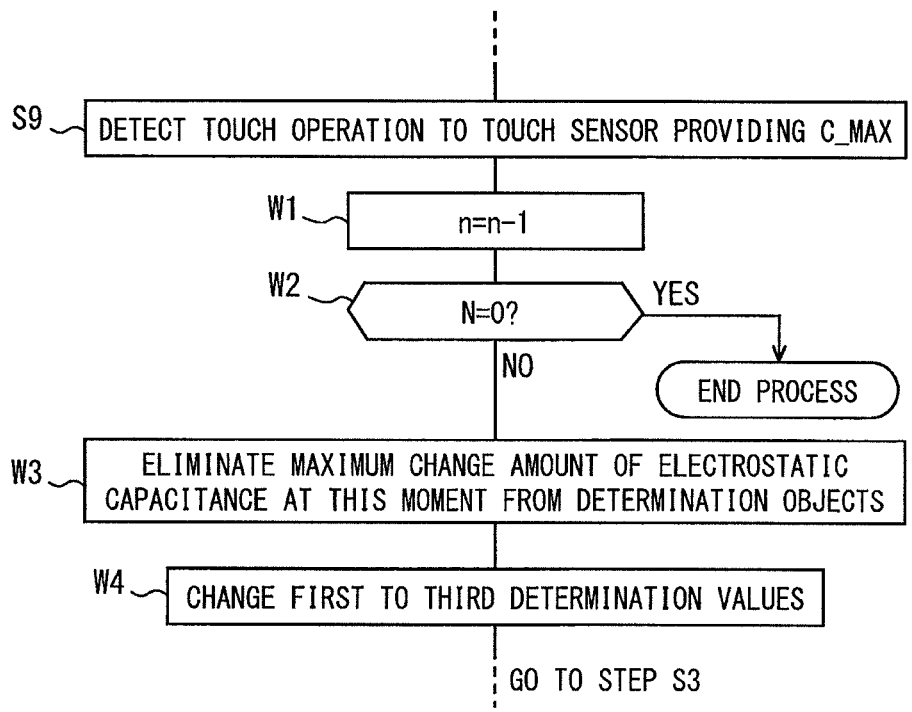
FIG. 8 is a diagram showing a process added to a determination step according to a third embodiment.

As shown in FIG. 8, after it is determined at step S9 that the touch operation with respect to the touch sensor having the maximum change amount of the electrostatic capacitance is performed, step W1 is executed. At step W1, the value of n is decremented (i.e., n=n−1). Then, at step W, it is determined whether the value of n is zero. When the value of n is zero (i.e, when the determination at step W2 is "YES"), the process ends without doing anything.

For example, when the device 11 has a construction that is capable of simultaneously detecting the touch operation with respect to one touch switch (i.e., n=1), the feature "n=0" is achieved at time when step W2 is executed firstly. Thus, the process ends without executing the steps after step W3. On the other hand, when the device 11 has a construction that is capable of simultaneously detecting the touch operation with respect to two or more touch switches (i.e., n>=2), the feature "n>=1" is achieved at time when step W2 is executed firstly. Thus, the steps after step W3 for determining the multi-touch operation are executed.

When the value of n is not zero (i.e., when the determination at step W2 is "NO"), it goes to step W3. At step W3, the touch switches having the maximum change amount of the electrostatic capacitance at this moment is excluded from the determination object at subsequent steps. Specifically, the detection value obtained as the maximum change amount C_MAX at step S3 is eliminated from the determination objects at the process after step S3, which is executed again later. As a result, at step S3 executed again later, the touch switch having the second largest change amount of the electrostatic capacitance at time when the previous step is executed is obtained as the maximum change amount C_MAX.

Then, step W4, the first determination value, the second determination value and the third determination value are changed. In the process after step S3, which is executed again after that, the maximum change amount of the electrostatic capacitance is eliminated from the determination objects. Accordingly, the maximum change amount C_MAX obtained at step S3 and the intermediate change amount C_N obtained at step S6 are different from those obtained previously. Accordingly, the first to third determination values are changed so as to obtain the optimum determination result at steps S4, S7 and S8 according to these changes. After step W4 is executed, it returns to step S3 in FIG. 4. Then, the process after step S3 is executed again, and the determination of the touch operation with respect to the second largest change amount of the electrostatic capacitance at time when the previous process is executed is performed. The above process is repeated by the number of times corresponding to the number of touch switches, which are capable of detecting simultaneously the touch operation.

The above described present embodiment provides similar effects as the first embodiment and the second embodiment. Further, the touch determination process according to the present embodiment can handle, using the same process content, a case of single touch detection that the touch operation with respect to one touch sensor is detected and a case of multi-touch detection that the touch operation with respect to two or more touch sensors is detected simultaneously. Thus, the effect for improving versatility is obtained.

Other Embodiments

The present disclosure is not limited to each embodiment described above and shown in the drawings. The present disclosure can be modified or expanded as follows.

A touch panel 7m in the vehicular navigation apparatus 1 may be a construction having an electrostatic capacitive touch switch. In this case, the touch determination process similar to above each embodiment may be applied to the touch switch of the touch panel 7m.

It is not limited to a construction such that one switch among switches 7a-7j corresponds to one touch sensor. Alternatively, a construction may be a case where one switch corresponds to multiple touch sensors.

Figure 5:
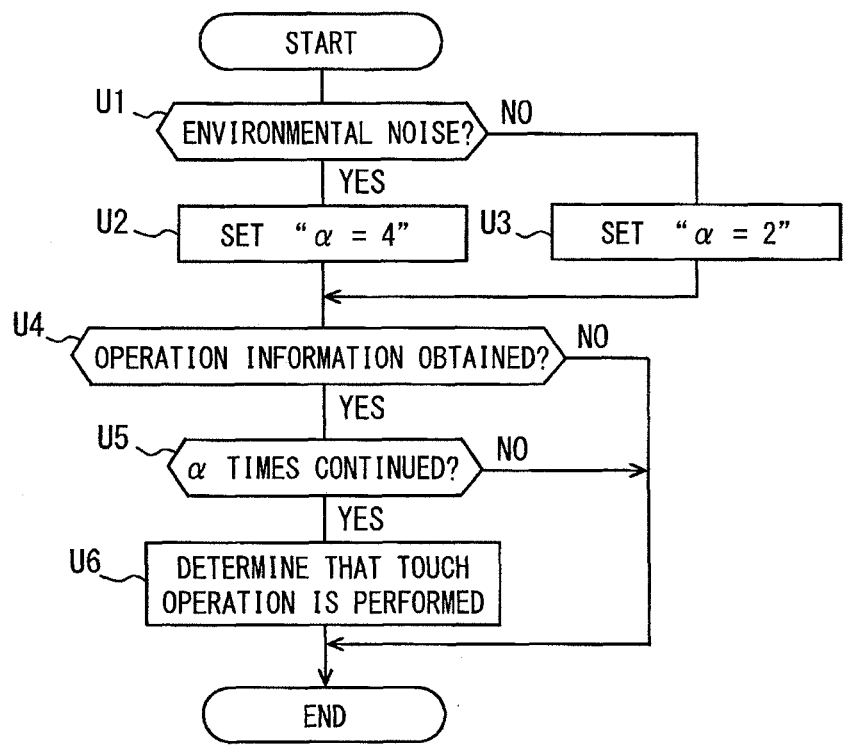
FIG. 5 is a flowchart showing a process content of a determination control unit.

Steps U1 to U3 and U5 may be skipped from the process content in FIG. 5, which is executed by the determination control unit 14. Specifically, when the determination control unit 14 obtains the operation detection information, from the touch detecting unit 13, indicative that it is determined that the touch operation with respect to a predetermined touch sensor is performed (i.e., when the determination at step U4 is "YES"), it goes to step U6. Then, the final determination may be performed such that the touch operation with respect to the predetermined touch sensor is performed.

When the touch detection device 11 has a construction that is capable of detecting the touch operation with respect to two touch switches simultaneously (i.e., n=2), the touch determination process (a process shown in FIG. 4) may be changed as follows. Specifically, at step S4, it is determined whether the difference between the baseline C_BL and the detection value C_2 of the touch sensor having the second largest change amount of the electrostatic capacitance exceeds the first determination value. Further, at step S7, it is determined whether the difference between the intermediate change amount C_N and the detection value C_2 of the touch sensor having the second largest change amount of the electrostatic capacitance exceeds the second determination value. Thus, the multi-touch operation is detected with high accuracy.

The touch detection device 11 is not limited to use for the detection of the touch operation with respect to the switches 7a-7j arranged in the vehicular navigation apparatus 1. Alternatively, the device 11 may be used for detecting the touch operation with respect to m electrostatic capacitive touch sensors (here, m defines the natural number equal to or more than three). For example, when the device 11 is used for a display apparatus having a comparative wide screen (e.g., a 50 inches screen) with a touch panel, the following effects are obtained. Specifically, when the touch sensors are dispersed in a wide area on the touch panel having the large size, and a electric equipment such as the cell phone outputting the electric wave is brought close to a side of the touch panel, only the touch sensors arranged on the side of the touch panel is affected by the influence of the strong electric wave output from the cell phone. In such a case, when each process described in each embodiment is performed, the occurrence of the detection error (i.e., operation error) caused by the electric wave is prevented.

In the drawings, the reference numeral of 1 represents the vehicular navigation apparatus, the reference numerals of 7a-7j represent the switches, the reference numeral of 11 represents the touch detection device, the reference numeral of 12 represents the electrostatic capacitance detecting unit (i.e., the electrostatic capacitance detection device), the reference numeral of 15 represents the touch detection device, and the reference numerals of 16a-16j represent the touch sensors.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A touch detection device for detecting a touch operation with respect to m electrostatic capacitive touch sensors, wherein m represents a natural number equal to or larger than three, the touch detection device comprising:
   an electrostatic capacitance detection device that detects an electrostatic capacitance of each touch sensor; and
   a touch detection device that executes a touch determination process for determining presence or absence of the touch operation with respect to each touch sensor based on a detected electrostatic capacitance of the electrostatic capacitance detection device,
   wherein the touch determination device detects the touch operation with respect to n touch sensors among m touch sensors simultaneously,
   wherein n represents a natural number equal to or smaller than (m−2),
   wherein the touch determination process includes:
      a change amount calculation step for obtaining a change amount of the detected electrostatic capacitance of each touch sensor based on the detected electrostatic capacitance of the electrostatic capacitance detection device;

a maximum value obtaining step for obtaining the detected electrostatic capacitance of the touch sensor having a maximum change amount among the touch sensors as a maximum detected electrostatic capacitance;

a change amount determination step for determining whether a difference between the maximum detected electrostatic capacitance and a predetermined standard value exceeds a first determination value;

a minimum value obtaining step for obtaining the detected electrostatic capacitance of the touch sensor having a minimum change amount among the touch sensors as a minimum detected electrostatic capacitance when it is determined at the change amount determination step that the difference exceeds the first determination value;

an intermediate value obtaining step for obtaining the detected electrostatic capacitance of the touch sensor having a (n+1)-th largest change amount among the touch sensors as an intermediate detected electrostatic capacitance when it is determined at the change amount determination step that the difference exceeds the first determination value; and a determination step for determining that the touch operation with respect to the touch sensor having the maximum change amount is performed when both of a first condition that a difference between the maximum detected electrostatic capacitance and the intermediate electrostatic capacitance exceed a second determination value and a second condition that a difference between the intermediate detected electrostatic capacitance and the minimum detected electrostatic capacitance is smaller than a third determination value are satisfied, and for determining that a change of the electrostatic capacitance is caused by a noise when at least one of the first condition and the second condition is not satisfied.

2. The touch detection device according to claim 1, wherein the touch determination device:
   repeatedly executes the touch determination process with a predetermined period;
   executes a final determination that, when it is determined that the touch operation with respect to a same touch sensor is performed a predetermined number of determination times consecutively in the repeatedly executed touch determination process, the touch operation with respect to the same touch sensor is performed; and
   increases the predetermined number of determination times when it is determined at the determination step that the electrostatic capacitance is caused by the noise.

3. The touch detection device according to claim 1, wherein, when n is equal to or larger than two, the determination step further includes:
   obtaining a difference between the maximum value and each of the detected electrostatic capacitances from a second largest change amount to a n-th largest change amount among m touch sensors; and
   determining that the touch operation with respect to the touch sensor corresponding to the detected electrostatic capacitance is performed when the difference is smaller than a fourth determination value.

4. A vehicular navigation apparatus comprising:
m switches using electrostatic capacitive touch sensors; and
the touch detection device according to claim 1,
wherein the touch operation with respect to each switch is detected using the touch detection device.

\* \* \* \* \*